(12) United States Patent
Matsushita

(10) Patent No.: US 12,419,068 B2
(45) Date of Patent: Sep. 16, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kenichi Matsushita, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 707 days.

(21) Appl. No.: 17/689,828

(22) Filed: Mar. 8, 2022

(65) Prior Publication Data

US 2023/0085921 A1    Mar. 23, 2023

(30) Foreign Application Priority Data

Sep. 21, 2021   (JP) ................. 2021-153420

(51) Int. Cl.
*H01L 29/66*    (2006.01)
*H10D 12/00*    (2025.01)
*H10D 12/01*    (2025.01)
*H10D 64/27*    (2025.01)

(52) U.S. Cl.
CPC ......... *H10D 12/481* (2025.01); *H10D 12/038* (2025.01); *H10D 12/421* (2025.01); *H10D 64/513* (2025.01)

(58) Field of Classification Search
None
See application file for complete search history.

(56) References Cited

U.S. PATENT DOCUMENTS

| | | | |
|---|---|---|---|
| 5,969,400 A | 10/1999 | Shinohe et al. | |
| 2012/0273836 A1* | 11/2012 | Sadamatsu | ........... H10D 62/106 257/E29.197 |
| 2018/0323294 A1* | 11/2018 | Okuda | ..................... H10D 8/00 |
| 2020/0091283 A1 | 3/2020 | Matsushita | |

FOREIGN PATENT DOCUMENTS

| | | |
|---|---|---|
| JP | H08-274317 A | 10/1996 |
| JP | H108-316480 A | 11/1996 |
| JP | 2020-047682 A1 | 3/2020 |

* cited by examiner

*Primary Examiner* — Matthew C Landau
*Assistant Examiner* — Vincent Kipkemoi Rono
(74) *Attorney, Agent, or Firm* — Knobbe, Martens, Olson & Bear, LLP

(57) ABSTRACT

A semiconductor device includes a semiconductor part and first to fourth electrodes. The semiconductor part includes a first layer of a first conductivity type and second and third layers of a second conductivity type. The first and second electrodes are provided on back and front surfaces of the semiconductor part, respectively. The third electrode is provided inside a trench of the semiconductor part. The fourth electrode is provided on the front surface of the semiconductor part. The first layer extends between the first electrode and the second and fourth electrodes. The second layer is provided between the first layer and the second electrode. The third layer is provided between the first layer and the fourth electrode. The third electrode includes an end provided between the third layer and the fourth electrode. The third layer is electrically connected to the second electrode via the third and fourth electrodes.

14 Claims, 14 Drawing Sheets

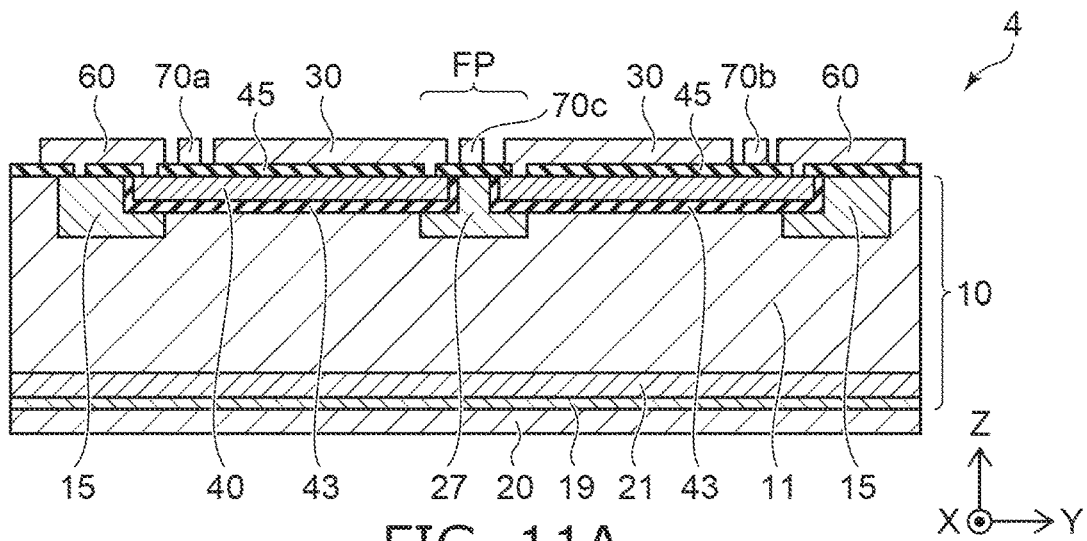
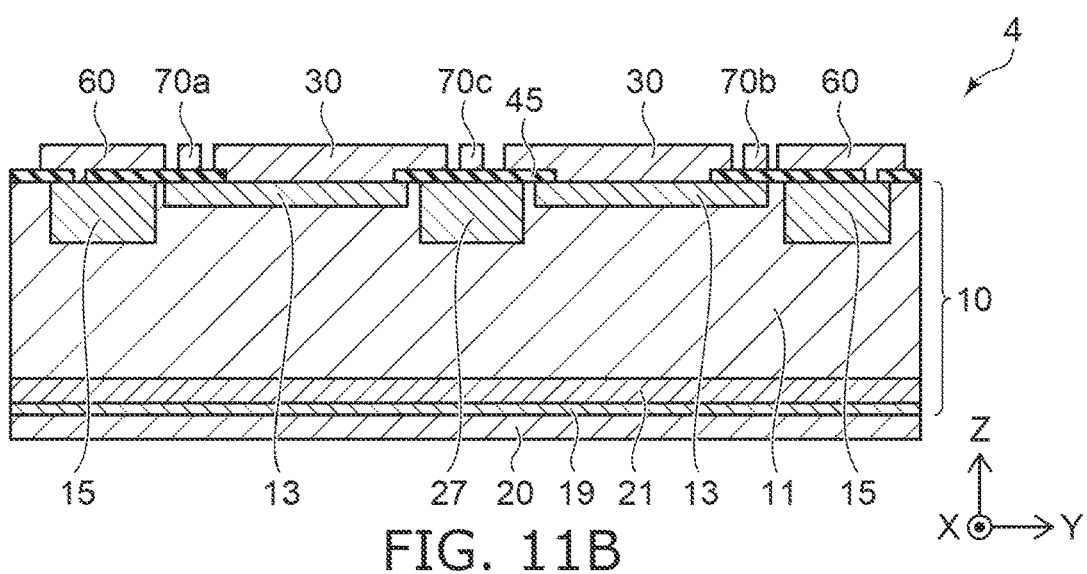
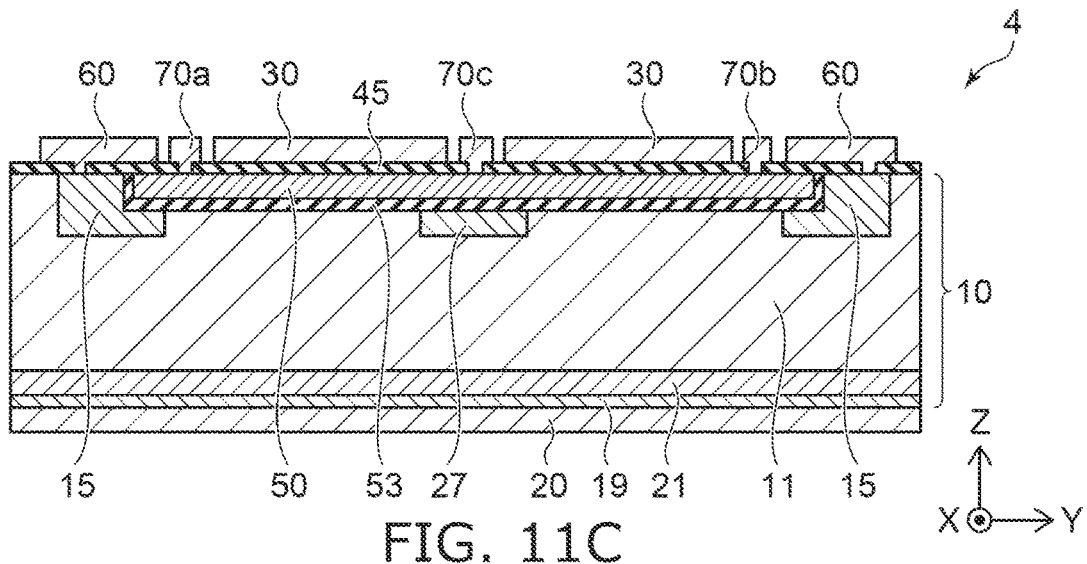

SEMICONDUCTOR DEVICE

CROSS-REFERENCE TO RELATED APPLICATIONS

This application is based upon and claims the benefit of priority from Japanese Patent Application No. 2021-153420, filed on Sep. 21, 2021; the entire contents of which are incorporated herein by reference.

FIELD

Embodiments described herein relate generally to a semiconductor device.

BACKGROUND

It is desirable for a semiconductor device used in the power converter or the like to have high reliability. For example, high breakdown immunity is important under high voltage and high current operation.

BRIEF DESCRIPTION OF THE DRAWINGS

FIGS. 11A to 11C are schematic cross-sectional views showing a semiconductor device according to a third modification of the embodiment;

DETAILED DESCRIPTION

Figure 1:
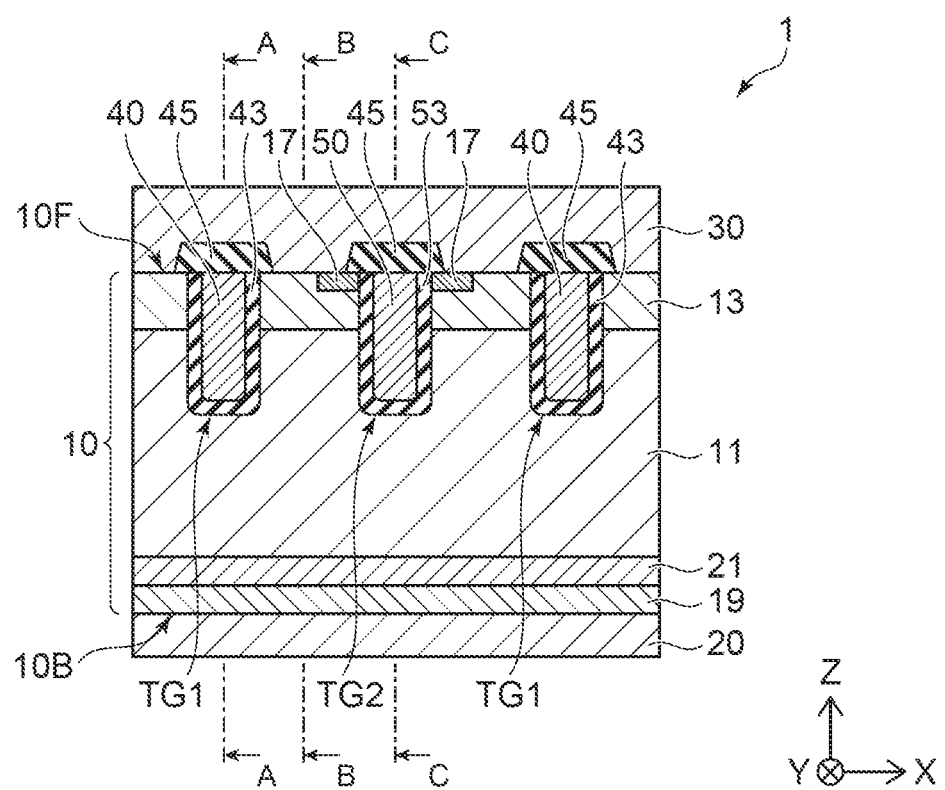
FIG. 1 is a schematic cross-sectional view showing a semiconductor device according to an embodiment.

According to one embodiment, a semiconductor device includes a semiconductor part, a first electrode, a second electrode, a third electrode, a first insulating film and a fourth electrode. The semiconductor part includes a first semiconductor layer of a first conductivity type, a second semiconductor layer of a second conductivity type, and a third semiconductor layer of the second conductivity type. The first electrode is provided on a back surface of the semiconductor part. the second electrode is provided on a front surface of the semiconductor part. The semiconductor part has a trench provided at the front surface side. The third electrode is provided inside the trench of the semiconductor part. The third electrode is electrically connected to the second electrode and extends from the front surface side into the semiconductor part. The first insulating film is provided between the third electrode and the semiconductor part. The first insulating film electrically insulates the third electrode from the semiconductor part. The fourth electrode is provided on the front surface of the semiconductor part. The fourth electrode is apart from the second electrode. The first semiconductor layer extends between the first electrode and the second electrode and between the first electrode and the fourth electrode. The second semiconductor layer is provided between the first semiconductor layer and the second electrode, and electrically connected to the second electrode. The third semiconductor layer is provided between the first semiconductor layer and the fourth electrode. The third semiconductor layer surrounds the second semiconductor layer on the first semiconductor layer. The third semiconductor layer is apart from the second semiconductor layer. The third electrode extends in a first direction directed along the front surface of the semiconductor part. The third electrode includes a first end provided between the third semiconductor layer and the fourth electrode. The fourth electrode is electrically connected to the third semiconductor layer, and electrically connected to the first end of the third electrode. The third semiconductor layer is electrically connected to the second electrode via the third and fourth electrodes.

Exemplary embodiments will now be described with reference to the drawings. Similar components in the drawings are marked with like reference numerals; a detailed description is omitted as appropriate; and the different portions are described. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

The arrangements and configurations of the portions are described using an X-axis, a Y-axis, and a Z-axis shown in the drawings. The X-axis, the Y-axis, and the Z-axis are orthogonal to each other and respectively refer to an X-direction, a Y-direction, and a Z-direction. The Z-direction may be described as up, and the opposite direction may be described as down.

FIG. 1 is a schematic cross-sectional view showing a semiconductor device 1 according to an embodiment.

Figure 2A:
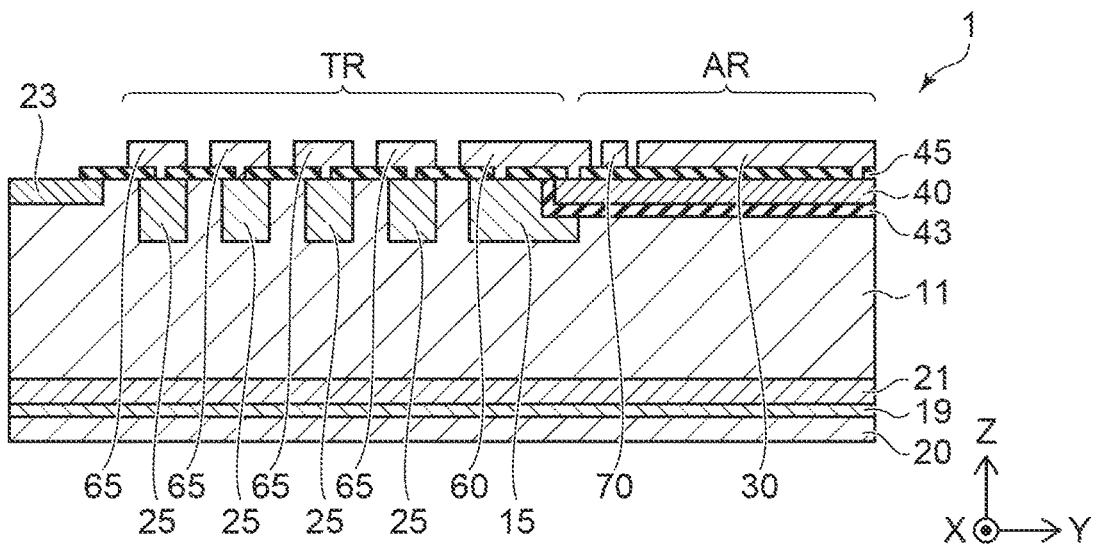
FIGS. 2A to 2C are other schematic cross-sectional views showing the semiconductor device according to the embodiment.
Figure 2B:
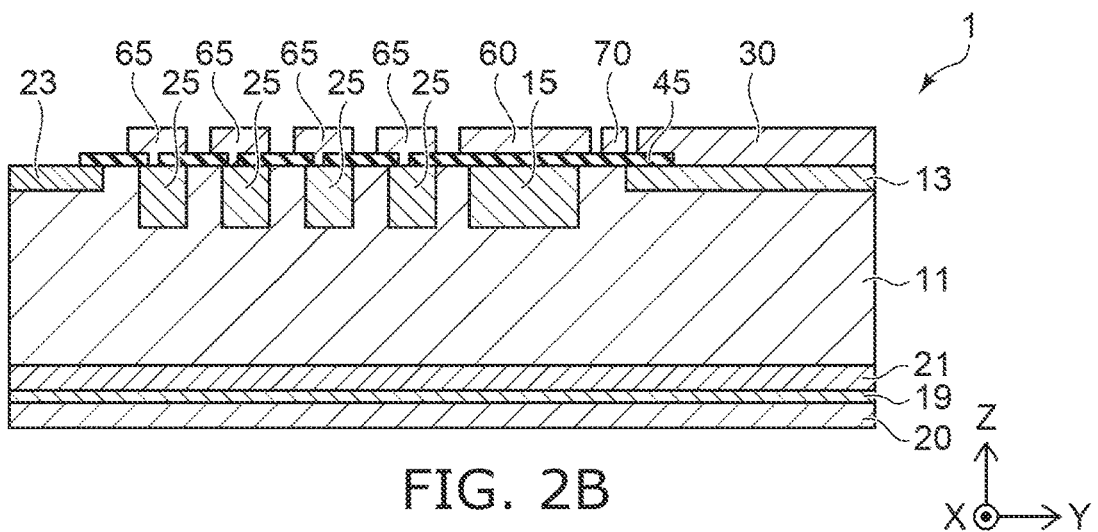
Figure 2C:
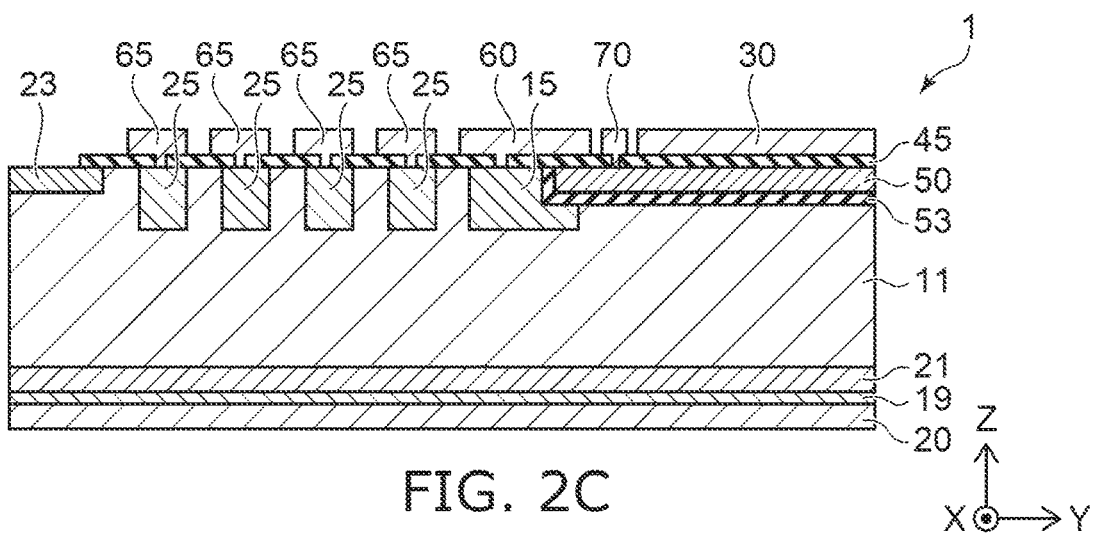

FIGS. 2A to 2C are other schematic cross-sectional views showing the semiconductor device 1 according to the embodiment. FIG. 2A is a cross-sectional view along line A-A shown in FIG. 1. FIG. 2B is a cross-sectional view along line B-B shown in FIG. 1. FIG. 2C is a cross-sectional view along line C-C shown in FIG. 1.

The semiconductor device 1 is, for example, an IGBT (Insulated Gate Bipolar Transistor). The semiconductor device 1 includes an active region AR and a termination region TR. FIG. 1 is a cross-sectional view showing the active region AR. FIGS. 2A to 2C are cross-sectional views showing the termination region TR.

As shown in FIG. 1, the semiconductor device 1 includes a semiconductor part 10, a first electrode 20, a second electrode 30, a third electrode 40, and a control electrode 50. The semiconductor part 10 includes a front surface 10F, and a back surface 10B at the side opposite to the front surface 10F. The semiconductor part 10 is, for example, silicon. The first electrode 20 is provided on the back surface of the semiconductor part 10. The second electrode 30 is provided on the front surface of the semiconductor part 10. The first electrode 20 is, for example, a collector electrode. The second electrode 30 is, for example, an emitter electrode.

The third electrode 40 is provided between the first electrode 20 and the second electrode 30. The semiconductor part 10 has a trench TG1 at the front surface side thereof, and the third electrode 40 is provided inside the trench TG1. The third electrode 40 is electrically insulated from the semiconductor part 10 by a first insulating film 43. A second insulating film 45 is provided between the second electrode 30 and the third electrode 40. The second insulating film 45 is, for example, an inter-layer insulating film. The first insulating film 43 and the second insulating film 45 are, for example, silicon oxide films.

The control electrode 50 is provided between the first electrode 20 and the second electrode 30. The semiconductor part 10 further has a trench TG2 at the front surface side thereof, and the control electrode 50 is provided inside the trench TG2. The control electrode 50 is electrically insulated from the semiconductor part 10 by a third insulating film 53. The control electrode 50 is electrically insulated from the second electrode 30 by the second insulating film 45. The third insulating film 53 is, for example, a gate insulating film. The third insulating film 53 is, for example, a silicon oxide film.

As shown in FIG. 1 and FIGS. 2A to 2C, the semiconductor part 10 includes, for example, a first semiconductor layer 11 of a first conductivity type, a second semiconductor layer 13 of a second conductivity type, a third semiconductor layer 15 of the second conductivity type, a fourth semiconductor layer 17 of the first conductivity type, a fifth semiconductor layer 19 of the second conductivity type, and a sixth semiconductor layer 21 of the first conductivity type. Hereinbelow, the first conductivity type is described as an n-type; and the second conductivity type is described as a p-type.

The first semiconductor layer 11 extends between the first electrode 20 and the second electrode 30. The first semiconductor layer 11 is, for example, an n-type base layer. The third electrode 40 and the control electrode 50 extend from the front surface side of the semiconductor part 10 into the first semiconductor layer 11.

The second semiconductor layer 13 is provided between the first semiconductor layer 11 and the second electrode 30. The second semiconductor layer 13 is, for example, a p-type base layer. The second semiconductor layer 13 faces the third electrode 40 via the first insulating film 43. Also, the second semiconductor layer 13 faces the control electrode 50 via the third insulating film 53.

The third semiconductor layer 15 is provided at the front surface side of the semiconductor part 10. The third semiconductor layer 15 is provided at the boundary between the active region AR and the termination region TR. The third semiconductor layer 15 is, for example, a p-type guard ring. The third semiconductor layer 15 is apart from the second semiconductor layer 13.

The fourth semiconductor layer 17 is partially provided between the second semiconductor layer 13 and the second electrode 30. The fourth semiconductor layer 17 is, for example, an n-type emitter layer. The fourth semiconductor layer 17 contacts the third insulating film 53. The second electrode 30 is electrically connected to the second and fourth semiconductor layers 13 and 17.

The fifth semiconductor layer 19 is provided between the first semiconductor layer 11 and the first electrode 20. The fifth semiconductor layer 19 is, for example, a p-type collector layer. The first electrode 20 is electrically connected to the fifth semiconductor layer 19.

The sixth semiconductor layer 21 is provided between the first semiconductor layer 11 and the fifth semiconductor layer 19. The sixth semiconductor layer 21 includes a first-conductivity-type impurity with a higher concentration than a concentration of a first-conductivity-type impurity in the first semiconductor layer 11. The sixth semiconductor layer 21 is, for example, an n-type buffer layer.

As shown in FIGS. 2A to 2C, the semiconductor part 10 further includes a seventh semiconductor layer 23 of the first conductivity type and an eighth semiconductor layer 25 of the second conductivity type in the termination region TR.

The seventh semiconductor layer 23 is apart from the third semiconductor layer 15 at the front surface side of the semiconductor part 10. The seventh semiconductor layer 23 includes a first-conductivity-type impurity with a higher concentration than the concentration of the first-conductivity-type impurity in the first semiconductor layer 11. The seventh semiconductor layer 23 is, for example, an n-type EQPR (Equivalent Potential Ring).

The eighth semiconductor layer 25 is provided at the front surface side of the semiconductor part 10. The eighth semiconductor layer 25 is provided between the third semiconductor layer 15 and the seventh semiconductor layer 23. The eighth semiconductor layer 25 is apart from the third and seventh semiconductor layers 15 and 23. The eighth semiconductor layer 25 is, for example, a p-type guard ring. For example, multiple eighth semiconductor layers 25 may be provided between the third semiconductor layer 15 and the seventh semiconductor layer 23.

The semiconductor device 1 further includes a fourth electrode 60, a fifth electrode 65, and control wiring 70. The fourth electrode 60 and the fifth electrode 65 are provided on the termination region TR of the semiconductor part 10. The control wiring 70, for example, is provided on the active region AR.

The second insulating film 45 extends from the active region AR to the termination region TR and covers the front surface of the termination region TR of the semiconductor part 10. The fourth electrode 60 and the fifth electrode 65 are provided on the second insulating film 45. The control wiring 70 is electrically insulated from the semiconductor part 10 and the third electrode 40 by the second insulating film 45.

The fourth electrode 60 is provided above the third semiconductor layer 15. In other words, the first semiconductor layer 11, the third semiconductor layer 15 and the fourth electrode 60 are arranged, for example, in the Z-direction, and the third semiconductor layer 15 is provided between the first semiconductor layer 11 and the fourth electrode 60. The fourth electrode 60 is electrically connected to the third semiconductor layer 15 via a contact hole provided in the second insulating film 45. The fourth electrode 60 is, for example, a field plate electrode.

As shown in FIG. 2A, the fourth electrode 60 also is provided above the end of the third electrode 40. The fourth electrode 60 is electrically connected to the third electrode 40 via another contact hole provided in the second insulating film 45. The third electrode 40 is electrically connected to the second electrode 30 via a contact hole provided in the second insulating film 45 in the active region AR. In other words, the third semiconductor layer 15 is electrically connected to the second electrode 30 via the fourth electrode 60 and the third electrodes 40.

The fifth electrode 65 is provided on the eighth semiconductor layer 25 with the second insulating film 45 interposed. The fifth electrode 65 is electrically connected to the eighth semiconductor layer 25 via a contact hole provided in the second insulating film 45. Multiple fifth electrodes 65 are provided on the multiple eighth semiconductor layers 25, respectively. The fifth electrode 65 is, for example, a field plate electrode.

As shown in FIG. 2B, the third semiconductor layer 15 is apart from the second semiconductor layer 13. The second semiconductor layer 13 is electrically connected to the second electrode 30 and has the same potential as a potential of the second electrode 30. On the other hand, the third semiconductor layer 15 is electrically connected to the second electrode 30 via the fourth electrode 60 and third electrode 40. The third electrode 40 is formed using, for example, conductive polysilicon. The electrical resistance of the third electrode 40 can be controlled by, for example, the doping level of the impurity in the polysilicon. The third semiconductor layer 15 is electrically connected to the second electrode 30 via a prescribed electrical resistance.

As shown in FIG. 2C, the control wiring 70, for example, provided at the front surface side of the semiconductor part 10, and is provided between the second electrode 30 and the fourth electrode 60. The control wiring 70 is apart from the second electrode 30 and the fourth electrode 60. The control wiring 70 is electrically connected to the control electrode 50 via a contact hole provided in the second insulating film 45.

Although the fifth semiconductor layer 19 (the p-type collector layer) extends from the active region AR to the termination region TR in the example described above, embodiments are not limited thereto. The fifth semiconductor layer 19 may be provided without the portion extending into the termination region TR. In such a case, the sixth semiconductor layer 21 is connected to the first electrode 20 in the termination region TR.

Figure 3:
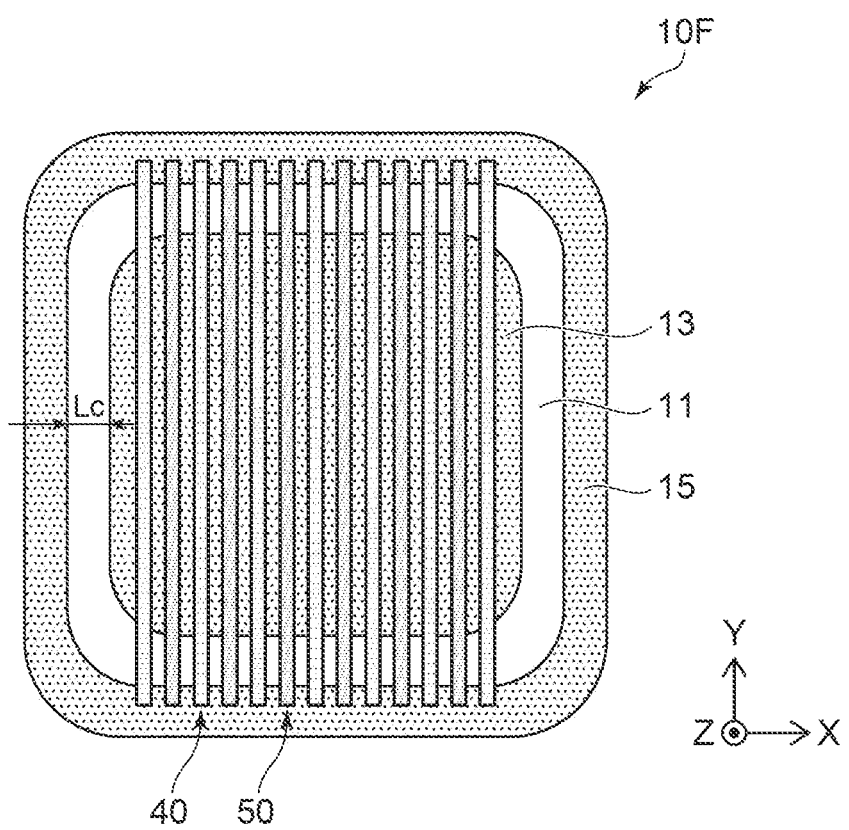
FIG. 3 is a schematic plan view showing the semiconductor device according to the embodiment.

FIG. 3 is a schematic plan view showing the semiconductor device 1 according to the embodiment. FIG. 3 is a plan view illustrating the front surface 10F of the semiconductor part 10. The fourth semiconductor layer 17, the first insulating film 43, and the third insulating film 53 are not illustrated in FIG. 3.

As shown in FIG. 3, the third semiconductor layer 15 surrounds the second semiconductor layer 13. The eighth semiconductor layer 25 (not illustrated) also surrounds the second semiconductor layer 13 outside the third semiconductor layer 15.

The third electrode 40 and the control electrode 50 extend, for example, in the Y-direction. The third electrode 40 and the control electrode 50 extend over the second semiconductor layer 13 and the third semiconductor layer 15. The third electrode 40 and the control electrode 50 each has two ends positioned inside the third semiconductor layer 15.

The third semiconductor layer 15 is apart from the second semiconductor layer 13. The first semiconductor layer 11 has a portion exposed between the second semiconductor layer 13 and the third semiconductor layer 15. A first distance Lc from the second semiconductor layer 13 to the third semiconductor layer 15 is provided appropriately.

Figure 4A:
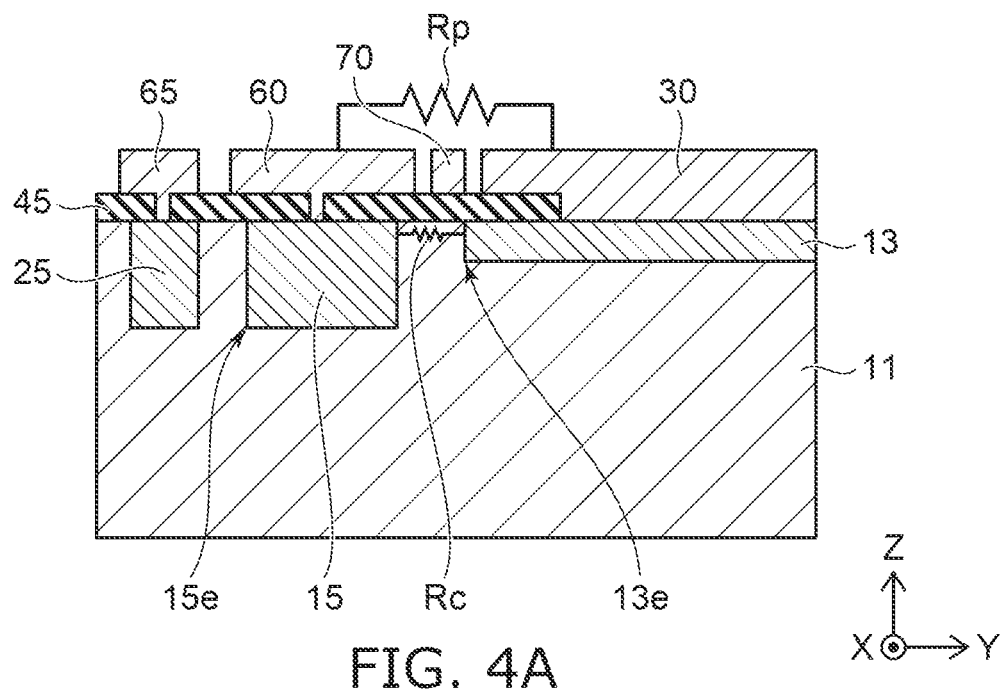
FIGS. 4A and 4B are schematic views showing a first characteristic of the semiconductor device according to the embodiment.
Figure 4B:
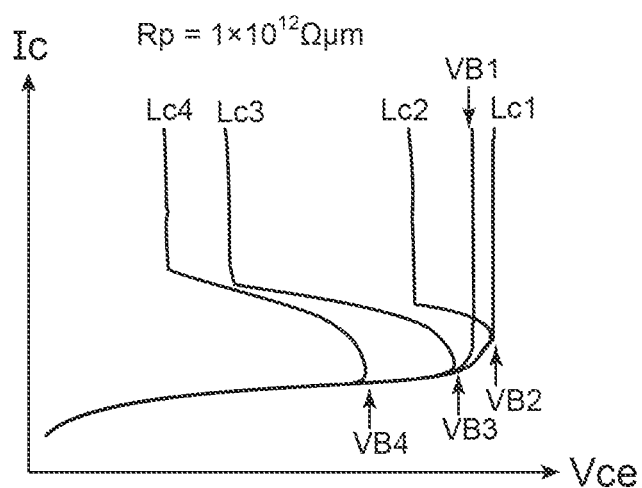

FIGS. 4A and 4B are schematic views showing a first characteristic of the semiconductor device 1 according to the embodiment. FIG. 4A is a partial cross-sectional view of the semiconductor device 1. FIG. 4B shows a current-voltage characteristic in the off-state of the semiconductor device 1. The horizontal axis is a voltage Vce applied between the first electrode 20 and the second electrode 30. The vertical axis is a current Ic flowing between the first electrode 20 and the second electrode 30.

As shown in FIG. 4A, the fourth electrode 60 is electrically connected to the second electrode 30 via an electrical resistance Rp. The fourth electrode 60 is electrically connected to the second electrode 30 via the third electrode 40 (referring to FIG. 2A). In other words, the electrical resistance Rp is the electrical resistance of the third electrode 40. The third semiconductor layer 15 is electrically connected to the fourth electrode 60. In other words, the third semiconductor layer 15 is electrically connected to the second electrode 30 via the electrical resistance Rp.

The first semiconductor layer 11 has a portion extending between the second semiconductor layer 13 and the third semiconductor layer 15. The first semiconductor layer 11 contacts, for example, the second insulating film 45 between the second semiconductor layer 13 and the third semiconductor layer 15. Therefore, in the off-state of the semiconductor device 1, the second semiconductor layer 13 and the third semiconductor layer 15 are electrically connected via a p-type inversion layer induced between the first semiconductor layer 11 and the second insulating film 45. Here, the channel resistance of the p-type inversion layer is taken as Rc.

The current-voltage characteristic in the off-state of the semiconductor device 1 is determined by a balance between the electrical resistance Rp and the channel resistance Rc. The electrical resistance Rp is controlled by, for example, the impurity concentration of the polysilicon included in the third electrode 40. The channel resistance Rc is determined by the first distance Lc from the second semiconductor layer 13 to the third semiconductor layer 15 (referring to FIG. 3). The channel resistance Rc increases as the first distance Lc increases.

FIG. 4B shows the current-voltage characteristic of the semiconductor device 1 in which first distances Lc1 to Lc4 are parameters. Here, the electrical resistance Rp is $1 \times 10^{12}$ $\Omega\mu m$. Lc1 to Lc4 have the relationship of Lc1<Lc2<Lc3<Lc4.

As shown in FIG. 4B, a breakdown voltage VB increases from VB1 to VB2 as the first distance Lc increases from Lc1 to Lc2. Furthermore, as the first distance Lc is increased from Lc3 to Lc4, the breakdown voltage VB decreases from VB3 to VB4, which are less than VB1. In other words, the electric field distribution in the termination region TR is changed as the first distance Lc is changed. The breakdown voltage VB is changed corresponding to the movement of the breakdown point at which the avalanche breakdown occurs. The breakdown point moves from an outer edge 15e of the third semiconductor layer 15 to an outer edge 13e of the second semiconductor layer 13 due to the change of the electric field distribution.

When the first distance Lc is set to Lc2, Lc3, and Lc4, after the voltage Vce reaches the breakdown voltages VB2, VB3, and VB4, so-called snapback occurs from which the voltage Vce decreases as the current Ic increases. When such snapback occurs, the current Ic acceleratingly increases, and overcurrent may induce element breakdown.

Figure 5:
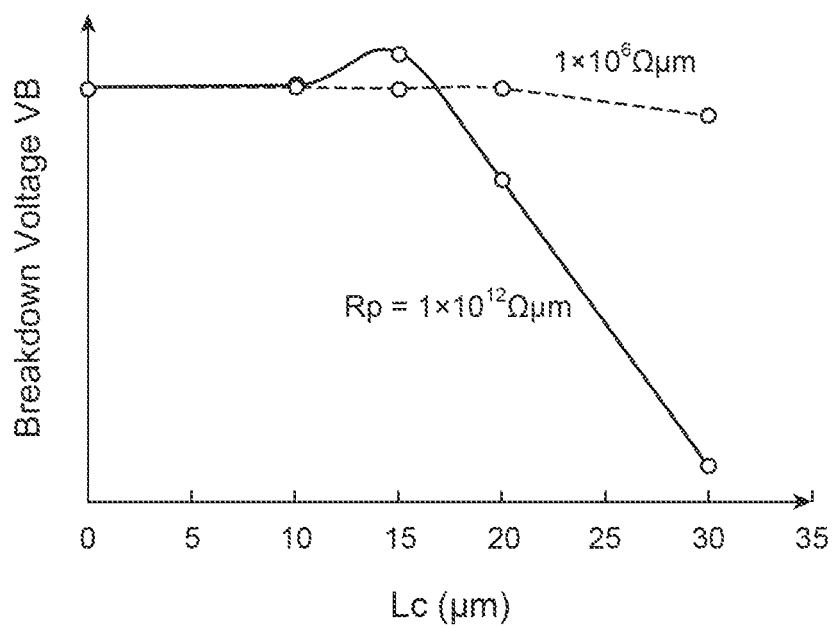
FIG. 5 is a graph showing a second characteristic of the semiconductor device according to the embodiment.

FIG. 5 is a graph showing a second characteristic of the semiconductor device 1 according to the embodiment. In FIG. 5, the horizontal axis is the first distance Lc, and the vertical axis is the breakdown voltage VB.

As shown in FIG. 5, when the electrical resistance Rp is $1×10^{12}$ Ωμm, the breakdown voltage VB is constant until the first distance Lc reaches 10 μm. On the other hand, the breakdown voltage VB increases between Lc=10 μm to 15 μm. Furthermore, the breakdown voltage VB decreases when the first distance Lc is greater than 15 μm.

When the first distance Lc is not more than 10 μm, the channel resistance Rc is small, and the potential difference between the second semiconductor layer 13 and the third semiconductor layer 15 is small. Therefore, the electric field at the outer edge 15e of the third semiconductor layer 15 (referring to FIG. 4A) increases, and avalanche breakdown occurs at the outer edge 15e. When the first distance Lc is greater than 15 μm, the channel resistance Rc increases, and the potential difference between the second semiconductor layer 13 and the third semiconductor layer 15 increases. Therefore, avalanche breakdown occurs at the outer edge 13e of the second semiconductor layer 13.

Thus, when Rp=$1×10^{12}$ Ωμm, the breakdown voltage VB increases while the breakdown point of the avalanche breakdown moves from the outer edge 15e of the third semiconductor layer 15 toward the outer edge 13e of the second semiconductor layer 13.

On the other hand, when Rp=$1×10^{6}$ Ωμm, the breakdown voltage VB is constant until the first distance Lc reaches 20 μm; and the breakdown voltage VB decreases when the first distance Lc is greater than 20 μm. The voltage drop between the third semiconductor layer 15 and the second electrode 30 decreases as the electrical resistance Rp decreases. Therefore, even if the first distance Lc is long, a high electric field can be maintained at the outer edge 15e of the third semiconductor layer 15 (referring to FIG. 4A). In other words, the avalanche breakdown at the outer edge 15e of the third semiconductor layer 15 is dominantly maintained. When the first distance Lc is greater than 20 μm, the avalanche breakdown occurs at the outer edge 13e of the second semiconductor layer 13 (referring to FIG. 4A), and the breakdown voltage VB decreases.

Figure 6A:
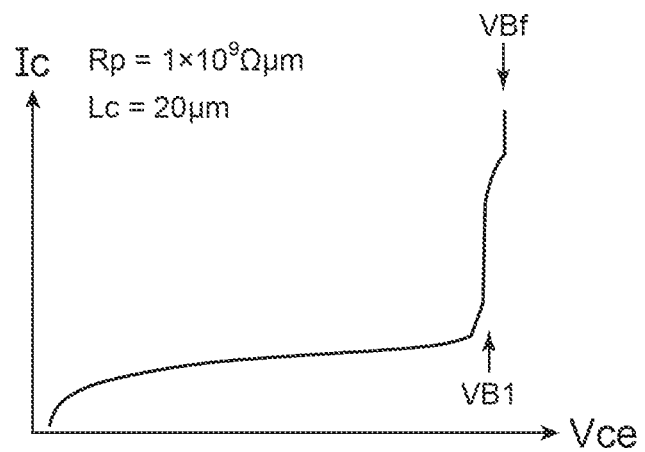
FIGS. 6A and 6B are schematic views showing a third characteristic of the semiconductor device according to the embodiment.
Figure 6B:
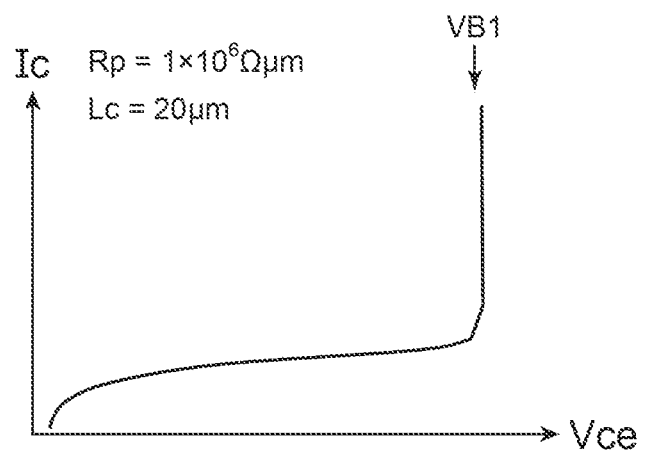

FIGS. 6A and 6B are schematic views showing a third characteristic of the semiconductor device 1 according to the embodiment. FIGS. 6A and 6B illustrate a current-voltage characteristic when Rp=$1×10^{9}$ Ωμm, Rp=$1×10^{6}$ Ωμm, and Lc=20 μm. The horizontal axis is the voltage Vce; and the vertical axis is the current Ic.

When the electrical resistance Rp is $1×10^{9}$ Ωμm, the avalanche breakdown occurs at a breakdown voltage VB1, after which the voltage Vce increases as the current Ic increases. Finally, the voltage Vce reaches a breakdown voltage VBf that is greater than VB1. In other words, when the electrical resistance Rp is the value between $1×10^{6}$ Ωμm and $1×10^{12}$ Ωμm, the breakdown voltage VBf is obtained which is greater than the breakdown voltage VB1 obtained when Rp=$1×10^{6}$ Ωμm.

Further, the voltage Vce increases as the current Ic increases after the initial avalanche breakdown. Thereby, it is possible to prevent the element breakdown, for example, due to snapback, and improve so-called breakover immunity.

FIGS. 7A to 7E are schematic cross-sectional views showing a fourth characteristic of the semiconductor device 1 according to the embodiment. FIGS. 7A to 7E illustrate a current-voltage characteristic when Rp is $1×10^{9}$ Ωμm and the first distance Lc is changed. The horizontal axis is the voltage Vce; and the vertical axis is the current Ic.

Figure 7A:
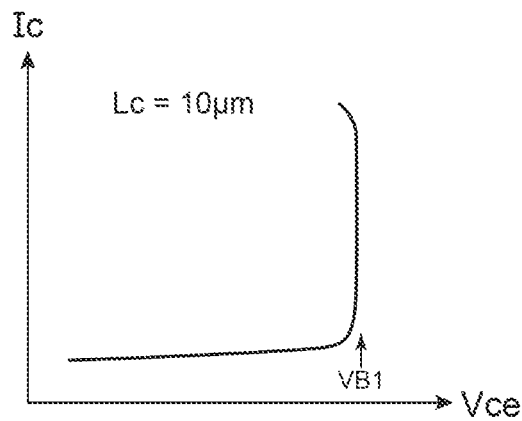
FIGS. 7A to 7E are schematic views showing a fourth characteristic of the semiconductor device according to the embodiment.

FIG. 7A illustrates the current-voltage characteristic when Lc=10 μm. As shown in FIG. 7A, when Vce=VB1, avalanche breakdown occurs.

Figure 7B:
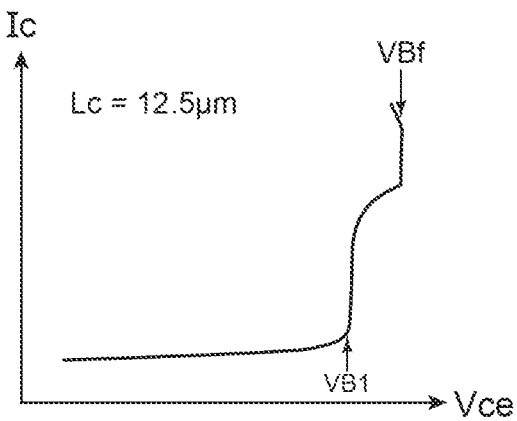

As shown in FIG. 7B, When Lc=12.5 μm, avalanche breakdown occurs at Vce=VB1, after which the voltage Vce increases as the current Ic increases. The voltage Vce finally reaches the breakdown voltage VBf.

Figure 7C:
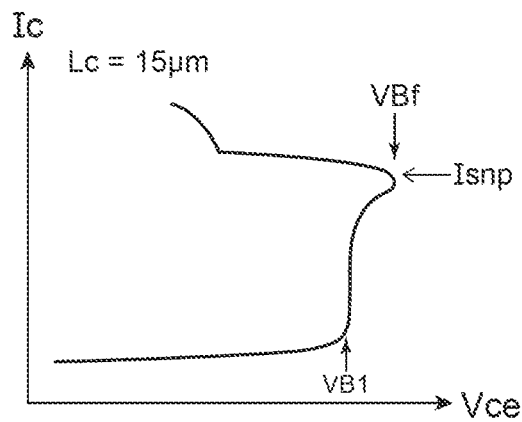
Figure 7D:
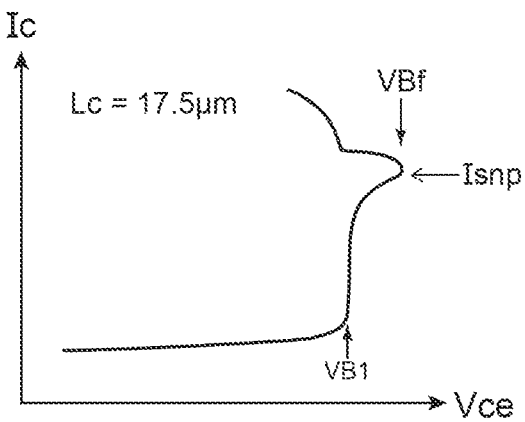

As shown in FIGS. 7C and 7D, when Lc=15 μm and Lc=17.5 μm, snapback occurs after Vce reaches VBf. In such a case, the current Isnp at which snapback occurs is greater than that of the example shown in FIG. 4B; and the breakover immunity is improved.

Figure 7E:
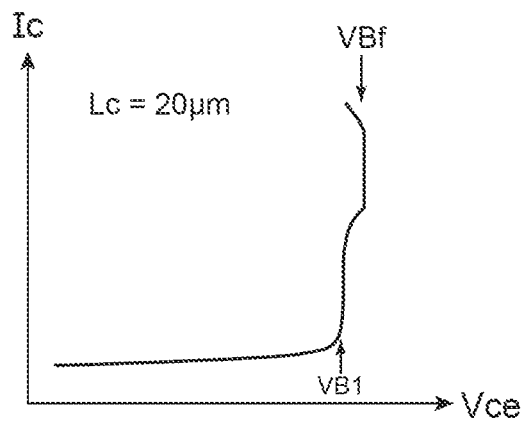

As shown in FIG. 7E, even when Lc=20 μm, avalanche breakdown occurs at Vce=VB1, after which the voltage Vce increases as the current Ic increases. The voltage Vce finally reaches the breakdown voltage VBf.

Thus, it is preferable to provide the first distance Lc that is, for example, greater than 10 μm and not more than 20 μm (referring to FIG. 5). It is more preferable to provide the first distance Lc that is not less than 12.5 μm and not more than 20 μm.

Figure 8:
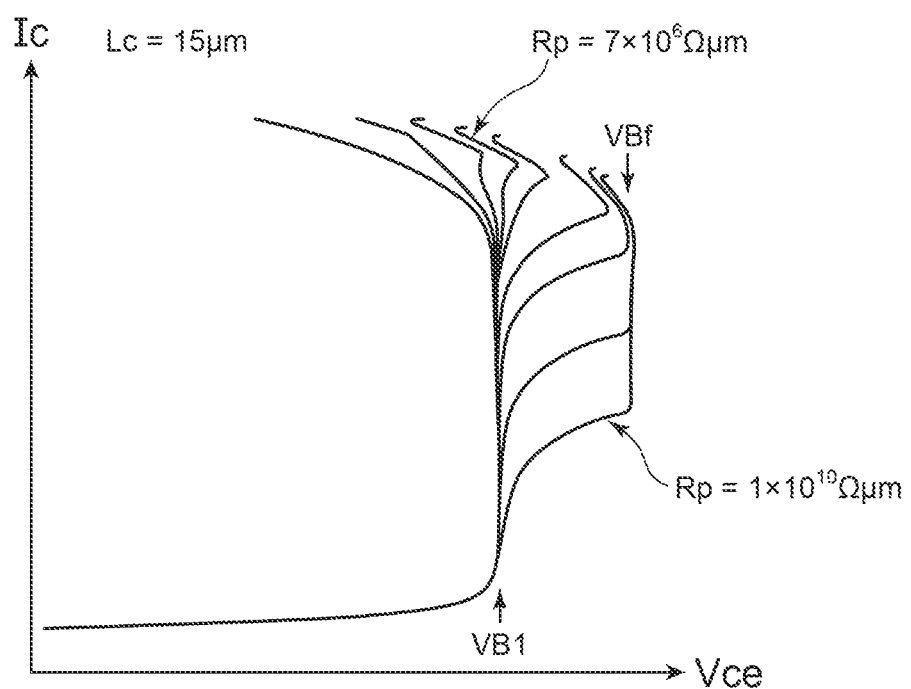
FIG. 8 is a schematic view showing a fifth characteristic of the semiconductor device according to the embodiment.

FIG. 8 is a schematic view showing a fifth characteristic of the semiconductor device 1 according to the embodiment. FIG. 8 illustrates a current-voltage characteristic when the first distance Lc is 15 μm and the electrical resistance Rp is changed. The horizontal axis is the voltage Vce; and the vertical axis is the current Ic.

As shown in FIG. 8, in the range of Rp=$7×10^{6}$ Ωμm to $1×10^{10}$ Ωμm, avalanche breakdown occurs when Vce=VB1, after which the voltage Vce increases as the current Ic increases. In other words, it is preferable to provide the electrical resistance Rp not less than $7×10^{6}$ Ωμm and not more than $1×10^{10}$ Ωμm.

Figure 9A:
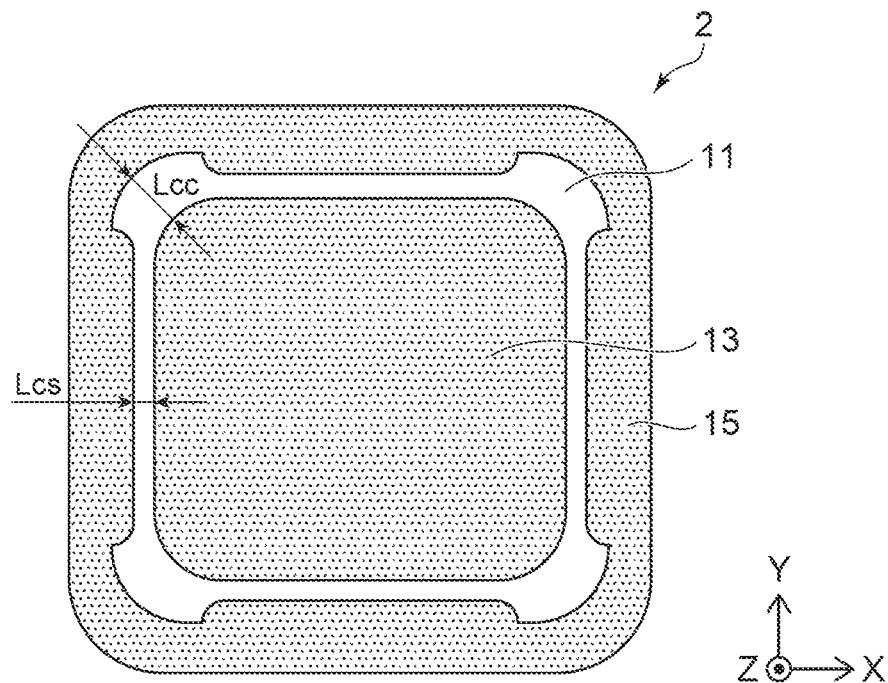
FIGS. 9A and 9B are schematic views showing a semiconductor device according to a first modification of the embodiment.
Figure 9B:
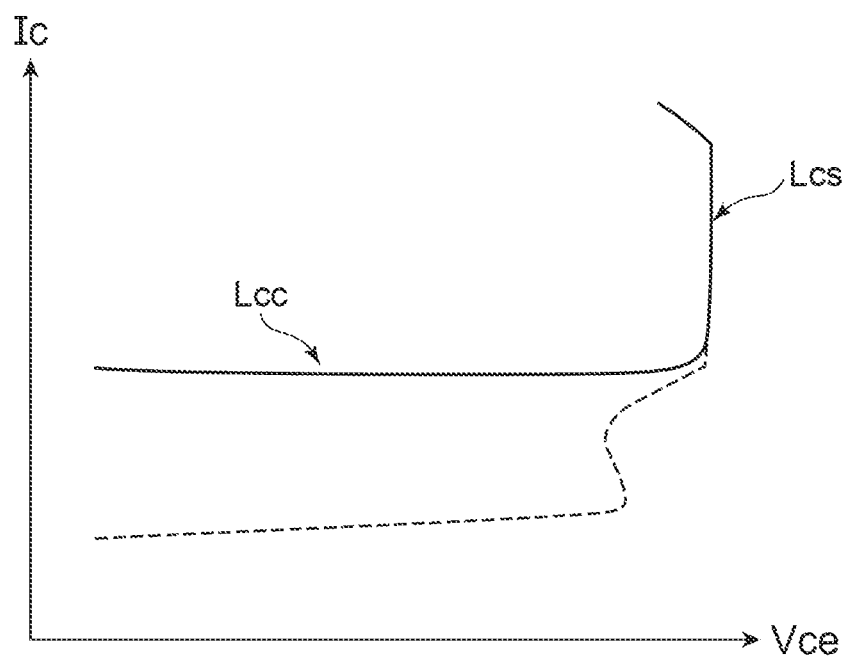

FIGS. 9A and 9B are schematic views showing a semiconductor device 2 according to a first modification of the embodiment. FIG. 9A is a plan view illustrating the front surface 10F of the semiconductor part 10. FIG. 9B shows a current-voltage characteristic in the off-state of the semiconductor device 2. The third electrode 40, the control electrode 50, the fourth semiconductor layer 17, the first insulating film 43, and the third insulating film 53 are not illustrated in FIG. 9A.

As shown in FIG. 9A, the semiconductor device 2 includes a first distance Lcs and a second distance Lcc that are between the second semiconductor layer 13 and the third semiconductor layer 15. The second semiconductor layer 13 has, for example, a quadrilateral shape in a plan view parallel to the front surface 10F of the semiconductor part 10 (referring to FIG. 1). The third semiconductor layer 15 also includes a quadrilateral outer edge, and surrounds the second semiconductor layer 13.

The first distance Lcs is provided between the side of the second semiconductor layer 13 and the inner edge of the third semiconductor layer 15. The second distance Lcc is provided between the corner of the second semiconductor layer 13 and the inner edge at the corner of the third semiconductor layer 15.

At the outer corner edge of the third semiconductor layer 15, for example, the electric field concentrates in the off-state and reduces the breakdown voltage VB of the termination region TR. Therefore, it is preferable to increase the breakdown voltage VB at the corner of the third semiconductor layer 15 by providing the second distance Lcc greater than the first distance Lcs. Thereby, the avalanche breakdown may occur along the outer side of the third semiconductor layer 15.

In FIG. 9B, the horizontal axis is the voltage Vce; and the vertical axis is the current Ic. As shown in FIG. 9B, before the avalanche breakdown occurs, the current Ic is large at the corner of the third semiconductor layer 15, because the electric field concentration easily occurs at the corner of the third semiconductor layer 15.

By providing the third semiconductor layer 15 in which the second distance Lcc is greater than the first distance Lcs, the avalanche breakdown occurs along the outer edge of the region at which the first distance Lcs is provided between the second semiconductor layer 13 and the third semiconductor layer 15. Thereby, it is possible to reduce the current concentration at the corner of the third semiconductor layer 15, and improve the breakover immunity.

Figure 10:
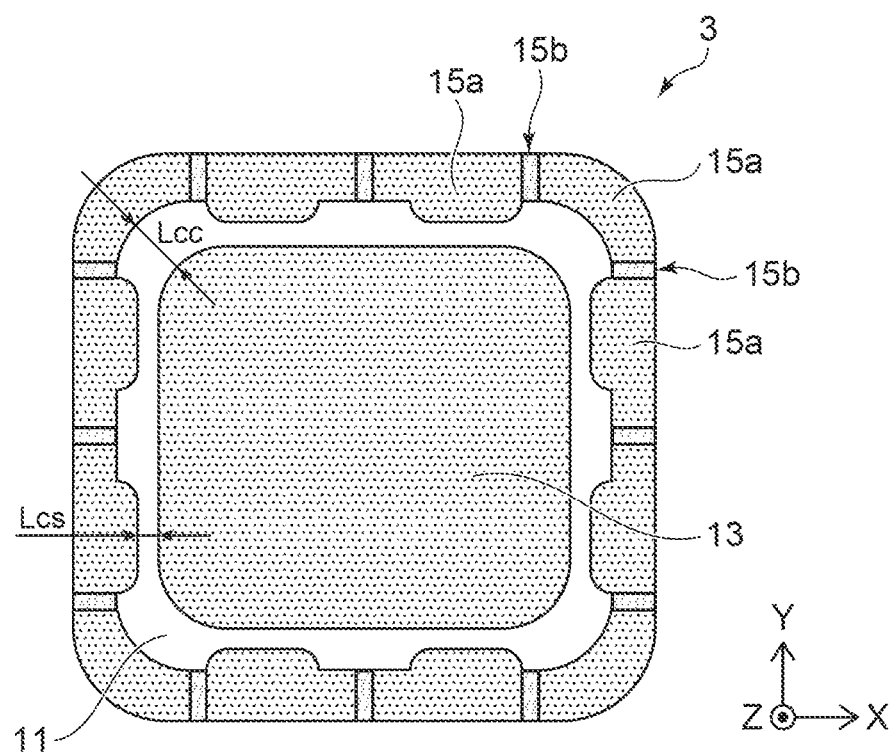
FIG. 10 is a schematic plan view showing a semiconductor device according to a second modification of the embodiment.

FIG. 10 is a schematic plan view showing a semiconductor device 3 according to a second modification of the embodiment. FIG. 10 is a plan view illustrating the front surface 10F of the semiconductor part 10. The third electrode 40, the control electrode 50, the fourth semiconductor layer 17, the first insulating film 43, and the third insulating film 53 are not illustrated in FIG. 10.

In the example, the first distance Lcs and the second distance Lcc are also provided between the second semiconductor layer 13 and the third semiconductor layer 15. The second semiconductor layer 13 has a quadrilateral shape in a plan view parallel to the front surface 10F of the semiconductor part 10 (referring to FIG. 1). The third semiconductor layer 15 that surrounds the second semiconductor layer 13 also has a quadrilateral outer edge.

As shown in FIG. 10, the third semiconductor layer 15 is subdivided into multiple portions 15a. A connection portion 15b is provided between the two portions 15a of the third semiconductor layer 15 that are next to each other. The connection portion 15b includes a second-conductivity-type impurity with a lower concentration than a concentration of a second-conductivity-type impurity in the multiple portions 15a.

The first distance Lcs is less than the second distance Lcc. The first distance Lcs is provided between the side of the second semiconductor layer 13 and the inner edge of the portion 15a among the multiple portions 15a of the third semiconductor layer 15. The portion 15a faces the side of the second semiconductor layer 13. The second distance Lcc is provided between the corner of the second semiconductor layer 13 and the inner edge of other portion 15a positioned at the corner of the third semiconductor layer 15. The second distance Lcc also is provided between the second semiconductor layer 13 and the connection portion 15b of the third semiconductor layer 15.

Thus, by subdividing the third semiconductor layer 15 with the connection portion 15b interposed, the potentials of the portions 15a in the off-state can be different from each other. Also, the avalanche breakdown occurs at the outer edge of the portion 15a of the third semiconductor layer 15 that is provided with the first distance Lcs. In the example, by dispersing the breakdown points of the avalanche breakdown, the current concentration can be reduced, and the breakover immunity can be improved.

FIGS. 11A to 11C are schematic cross-sectional views showing a semiconductor device 4 according to a third modification of the embodiment. FIG. 11A is a cross-sectional view of the active region AR along line A-A shown in FIG. 1. FIG. 11B is a cross-sectional view of the active region AR along line B-B shown in FIG. 1. FIG. 11C is a cross-sectional view of the active region AR along line C-C shown in FIG. 1.

As shown in FIG. 11A, the semiconductor device 4 includes, for example, two third electrodes 40 arranged in the Y-direction. The third electrodes 40 each are provided between the semiconductor part 10 and the second electrode 30. The second insulating film 45 is provided between the second electrode 30 and the third electrodes 40. The third electrodes 40 are electrically connected to the second electrode 30 via contact holes provided in the second insulating film 45. Also, the third electrodes 40 are electrically connected to the fourth electrode 60 via other contact holes provided in the second insulating film 45.

The semiconductor device 4 includes, for example, control wiring 70a, control wiring 70b, and control wiring 70c. The control wiring 70a, 70b, and 70c are electrically connected to, for example, a control pad (not illustrated) provided at the front surface side of the semiconductor part 10. The control wiring 70a, 70b, and 70c are provided at the front surface side of the semiconductor part 10 and are electrically insulated from the semiconductor part 10 by the second insulating film 45. The control wiring 70a and 70b are provided, for example, at the two ends in Y-direction of the active region AR (referring to FIG. 2A). The control wiring 70c is provided between the control wiring 70a and the control wiring 70b.

The semiconductor device 4 includes a so-called finger portion FP. The finger portion FP includes the control wiring 70c, and a ninth semiconductor layer 27 of the second conductivity type. The ninth semiconductor layer 27 is provided between the two third electrodes 40. The control wiring 70c is provided on the ninth semiconductor layer 27 with the second insulating film 45 interposed.

The two third electrodes 40 each include ends provided inside the ninth semiconductor layer 27. The second electrodes 30 are connected to the ends of the third electrodes 40 that are positioned inside the ninth semiconductor layer 27. Also, the third electrodes 40 are connected to the fourth electrodes 60 at other ends that are located at the sides opposite to the ends positioned inside the ninth semiconductor layer 27.

As shown in FIG. 11B, the ninth semiconductor layer 27 is apart from the second semiconductor layer 13. The first semiconductor layer 11 includes a portion extending between the second semiconductor layer 13 and the ninth semiconductor layer 27 and contacts the second insulating film 45. In such a case, the ninth semiconductor layer 27 is linked to the third semiconductor layer 15, for example, at the X-direction end (not illustrated).

As shown in FIG. 11C, the control electrode 50 extends in the Y-direction and is connected to the control wiring 70a, 70b, and 70c via contact holes provided in the second insulating film 45. For example, the control electrode 50 is connected to the control wiring 70a and 70b at the two ends in the Y-direction. The control electrode 50 includes a portion at the finger portion FP that is positioned between the control wiring 70c and a portion of the ninth semiconductor layer 27. The control electrode 50 is connected to the control wiring 70c at the finger portion FP.

Figure 12A:
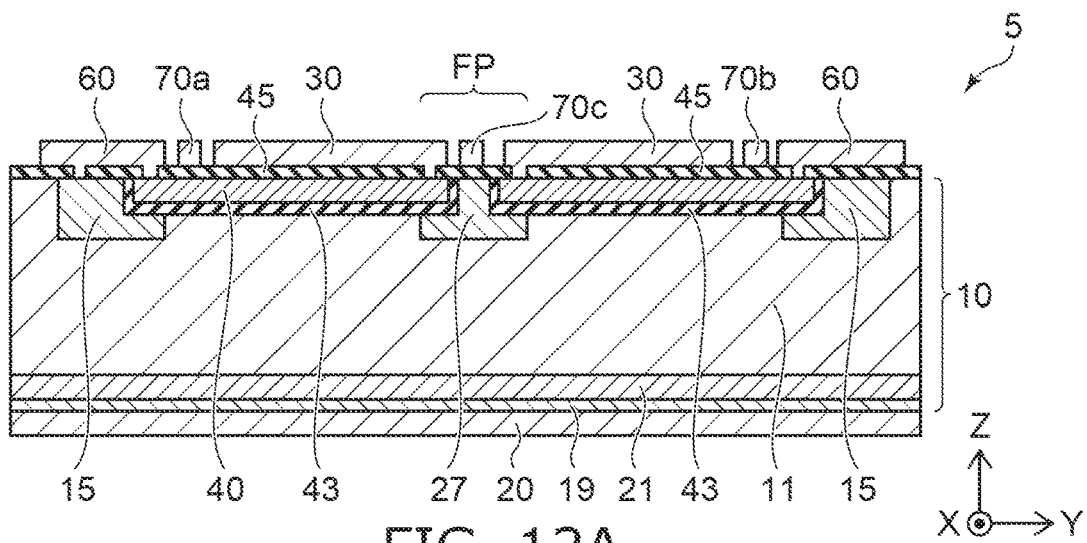
FIGS. 12A to 12C are schematic cross-sectional views showing a semiconductor device according to a fourth modification of the embodiment.
Figure 12B:
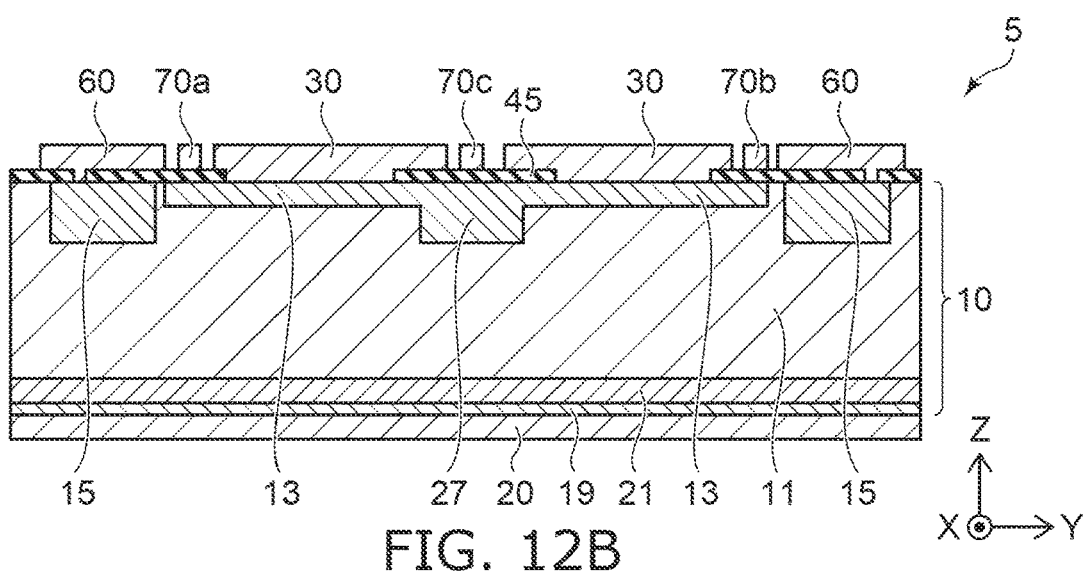
Figure 12C:
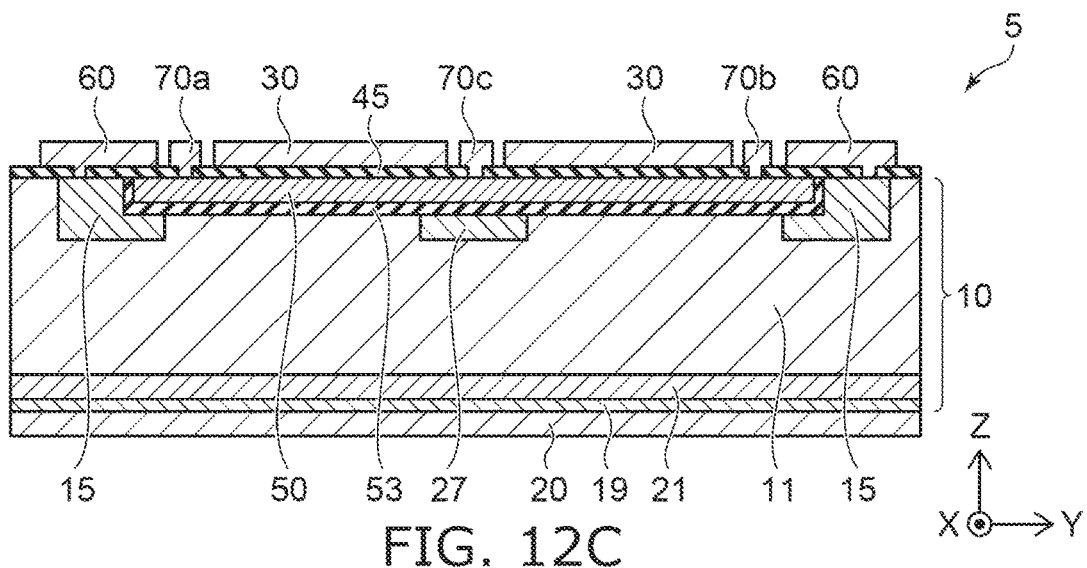

FIGS. 12A to 12C are schematic cross-sectional views showing a semiconductor device 5 according to a fourth modification of the embodiment. FIG. 12A is a cross-sectional view of the active region AR along line A-A shown in FIG. 1. FIG. 12B is a cross-sectional view of the active region AR along line B-B shown in FIG. 1. FIG. 12C is a cross-sectional view of the active region AR along line C-C shown in FIG. 1. The semiconductor device 5 is different in the relationship of the second semiconductor layer 13, the third semiconductor layer 15, and the ninth semiconductor layer 27 from the semiconductor device 4.

As shown in FIG. 12A, the semiconductor device 4 includes, for example, two third electrodes 40 arranged in the Y-direction. The third electrodes 40 are electrically connected to the second electrode 30. Also, the third electrodes 40 are electrically connected to the fourth electrode 60.

The finger portion FP includes the ninth semiconductor layer 27 and the control wiring 70c. The ninth semiconductor layer 27 is provided between the two third electrodes 40. The control wiring 70c is provided on the ninth semiconductor layer 27 with the second insulating film 45 interposed.

As shown in FIG. 12B, the ninth semiconductor layer 27 is linked to the second semiconductor layer 13. In such a case, the ninth semiconductor layer 27 is apart from the third semiconductor layer 15, for example, at the X-direction end (not illustrated).

As shown in FIG. 12C, the control electrode 50 extends in the Y-direction and is connected to the control wiring 70a, 70b, and 70c. For example, the control electrode 50 is connected to the control wiring 70a and 70b at the two ends in the Y-direction. Also, the control electrode 50 is connected to the control wiring 70c at the finger portion FP.

Figure 13A:
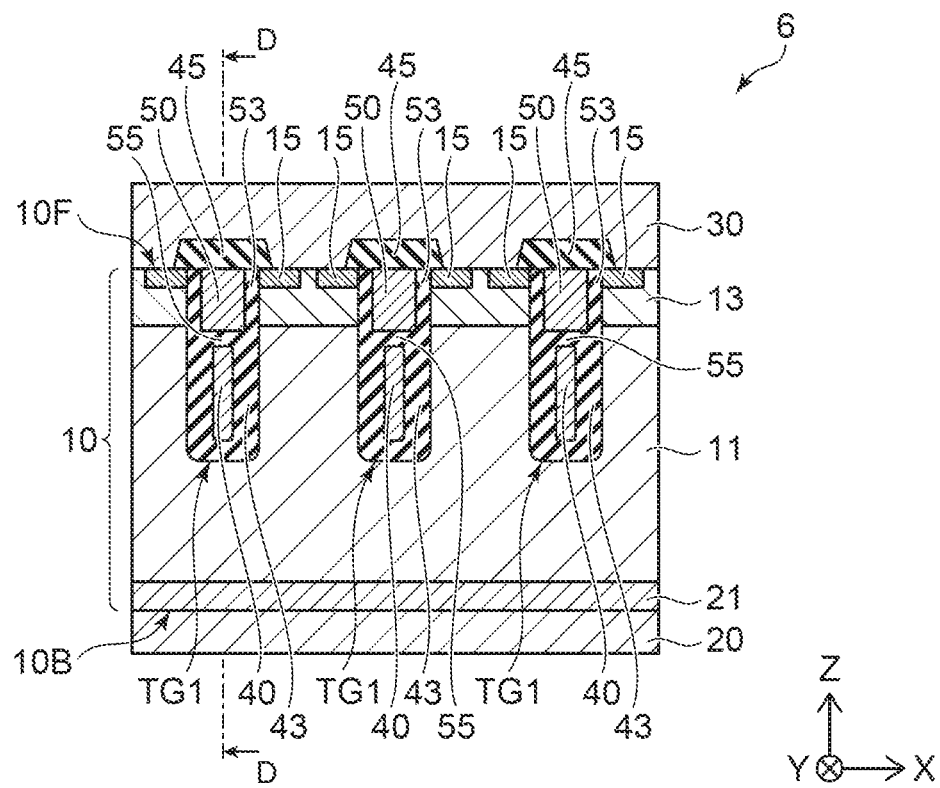
FIGS. 13A and 13B are schematic cross-sectional views showing a semiconductor device according to a fifth modification of the embodiment.
Figure 13B:
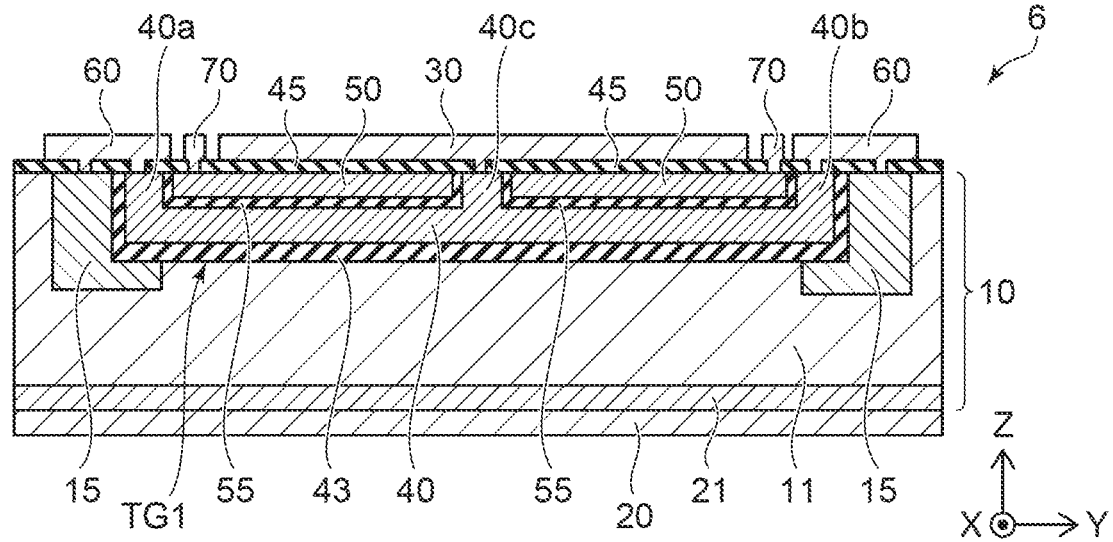

FIGS. 13A and 13B are schematic cross-sectional views showing a semiconductor device 6 according to a fifth modification of the embodiment. FIG. 13B is a cross-sectional view along line D-D shown in FIG. 13A. The semiconductor device 6 is, for example, a MOSFET.

As shown in FIG. 13A, the third electrode 40 and the control electrode 50 are provided inside one trench TG1. The third electrode 40 is provided between the first electrode 20 and the control electrode 50. The control electrode 50 is provided between the second electrode 30 and the third electrode 40.

The third electrode 40 is provided at the bottom surface side of the trench TG1 and faces the first semiconductor layer 11 via the first insulating film 43. The control electrode 50 faces the second semiconductor layer 13 via the third insulating film 53. A fourth insulating film 55 is provided between the third electrode 40 and the control electrode 50. The fourth insulating film 55 electrically insulates the third electrode 40 from the control electrode 50. The fourth insulating film 55 is, for example, a silicon oxide film.

As shown in FIG. 13B, the third electrode 40 and the control electrode 50 extend, for example, in the Y-direction. Two control electrodes 50 are arranged in the Y-direction. The third electrode 40 includes contact portions 40a and 40b that extend upward at the two ends in Y-direction of the trench TG1. Also, the third electrode 40 includes a contact portion 40c that extends upward between the two control electrodes 50.

The second electrode 30 is connected to the contact portion 40c of the third electrode 40 via a contact hole provided in the second insulating film 45. The fourth electrode 60 is connected to the contact portions 40a and 40c of the third electrode 40 via other contact holes provided in the second insulating film 45.

As shown in FIG. 13B, the control wiring 70 is provided between the second electrode 30 and the fourth electrode 60. The control wiring 70 is electrically insulated from the semiconductor part 10 by the second insulating film 45. The control wiring 70 is provided on the end of the control electrode 50 and is connected to the control electrode 50, for example, via a contact hole provided in the second insulating film 45.

In the example, the second electrode 30 also is electrically connected to the fourth electrode 60 via the third electrode 40. The fourth electrode 60 is electrically connected to the third semiconductor layer 15 via a contact hole provided in the second insulating film 45. In other words, the third semiconductor layer 15 is electrically connected to the second electrode 30 via the third electrode 40. The third semiconductor layer 15 is apart from the second semiconductor layer 13 (referring to FIG. 2B). Accordingly, also in the example, the breakover immunity can be improved by preferably providing the electrical resistance Rp of the third electrode 40 and the first distance Lc between the second semiconductor layer 13 and the third semiconductor layer 15.

Figure 14:
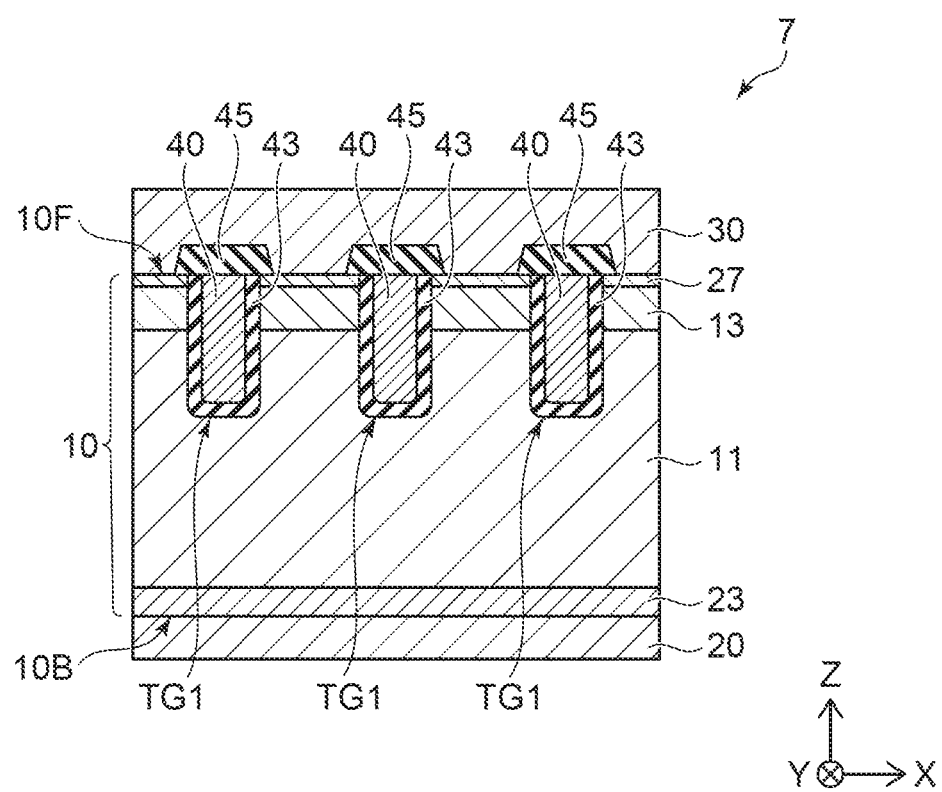
FIG. 14 is a schematic cross-sectional view showing a semiconductor device according to a sixth modification of the embodiment.

FIG. 14 is a schematic cross-sectional view showing a semiconductor device 7 according to a sixth modification of the embodiment. The semiconductor device 7 is, for example, a diode. The semiconductor device 7 can be used, for example, as a freewheeling diode that is integrated with an IGBT.

As shown in FIG. 14, the semiconductor device 7 includes multiple third electrodes 40 providing inside the trenches TG1. The third electrode 40 extends from the front surface side of the semiconductor part 10 into the first semiconductor layer 11. The second and ninth semiconductor layers 13 and 27 of the second conductivity type are provided between the third electrodes 40 that are next to each other.

The second semiconductor layer 13 is provided between the first semiconductor layer 11 and the second electrode 30. The ninth semiconductor layer 27 is provided between the second semiconductor layer 13 and the second electrode 30. The ninth semiconductor layer 27 includes a second-conductivity-type impurity with a higher concentration than a concentration of a second-conductivity-type impurity in the second semiconductor layer 13 and is electrically connected to the second electrode 30. The ninth semiconductor layer 27 is, for example, a p-type contact layer.

Also in the example, the second electrode 30 is electrically connected to the fourth electrode 60 via the third electrode 40 (referring to FIG. 2A). In other words, the second electrode 30 is electrically connected to the third semiconductor layer 15 (not illustrated) via the third electrode 40. The second semiconductor layer 13 is apart from the third semiconductor layer 15 (referring to FIG. 2B). Accordingly, the breakover immunity can be improved by preferably providing the electrical resistance Rp of the third electrode 40 and the first distance Lc between the second semiconductor layer 13 and the third semiconductor layer 15.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor part including a first semiconductor layer of a first conductivity type, a second semiconductor layer of a second conductivity type, and a third semiconductor layer of the second conductivity type;
a first electrode provided on a back surface of the semiconductor part;
a second electrode provided on a front surface of the semiconductor part, the semiconductor part having a trench provided at the front surface side;
a third electrode provided inside the trench of the semiconductor part, the third electrode being electrically connected to the second electrode and extending from the front surface side into the semiconductor part;
a first insulating film provided between the third electrode and the semiconductor part, the first insulating film electrically insulating the third electrode from the semiconductor part; and
a fourth electrode provided on the front surface of the semiconductor part, the fourth electrode being apart from the second electrode,
the first semiconductor layer extending between the first electrode and the second electrode and between the first electrode and the fourth electrode,
the second semiconductor layer being provided between the first semiconductor layer and the second electrode and electrically connected to the second electrode,
the third semiconductor layer being provided between the first semiconductor layer and the fourth electrode, the third semiconductor layer surrounding the second semiconductor layer on the first semiconductor layer, the third semiconductor layer being apart from the second semiconductor layer,
the third electrode extending in a first direction directed along the front surface of the semiconductor part, the third electrode including a first end provided between the third semiconductor layer and the fourth electrode,
the fourth electrode being electrically connected to the third semiconductor layer, and electrically connected to the first end of the third electrode,
the third semiconductor layer being electrically connected to the second electrode via a conductive path including the third and fourth electrodes.

2. The device according to claim 1, further comprising:
a second insulating film provided between the second electrode and the third electrode,
the third electrode being electrically connected to the second electrode via a contact hole provided in the second insulating film.

3. The device according to claim 2, wherein
the third electrode includes a second end at a side opposite to the first end, the second end being provided between the first electrode and the second electrode,
the first end and the second end of the third electrode are arranged in the first direction, and
the third electrode is electrically connected to the second electrode at the second end.

4. The device according to claim 2, wherein
the third electrode includes a second end at a side opposite to the first end,
the first end and the second end of the third electrode are arranged in the first direction, and
the third electrode is electrically connected to the second electrode at a center between the first end and the second end.

5. The device according to claim 2, wherein
the second insulating film extends between the semiconductor part and the fourth electrode, and the third semiconductor layer and the first end of the third electrode are electrically connected to the fourth electrode via other contact holes provided in the second insulating film.

6. The device according to claim 2, further comprising:
a control electrode provided between the first electrode and the second electrode; and
a third insulating film provided between the control electrode and the semiconductor part,
the semiconductor part having another trench provided at the front surface side, the control electrode being provided in said another trench,
the second semiconductor layer facing the third electrode via the first insulating film and the control electrode via the third insulating film,
the second insulating film extending between the second electrode and the control electrode and electrically insulating the control electrode from the second electrode,
the semiconductor part further including a fourth semiconductor layer of the first conductivity type,
the fourth semiconductor layer being partially provided between the second semiconductor layer and the second electrode,
the fourth semiconductor layer contacting the third insulating film and being electrically connected to the second electrode.

7. The device according to claim 6, further comprising:
a control wiring provided on the second insulating film between the second electrode and the fourth electrode,
the control wiring being electrically connected to the control electrode via yet another contact hole provided in the second insulating film.

8. The device according to claim 2, further comprising:
a control electrode provided inside the trench of the semiconductor part, the control electrode being provided between the third electrode and the second electrode;
a third insulating film provided between the control electrode and the semiconductor part; and
a fourth insulating film provided between the control electrode and the third electrode,
the first semiconductor layer facing the third electrode via the first insulating film,
the second semiconductor layer facing the control electrode via the third insulating film,
the second insulating film extending between the second electrode and the control electrode and electrically insulating the control electrode from the second electrode,
the semiconductor part further including a fourth semiconductor layer of the first conductivity type,
the fourth semiconductor layer being partially provided between the second semiconductor layer and the second electrode,
the fourth semiconductor layer contacting the third insulating film and being electrically connected to the second electrode.

9. The device according to claim 2, wherein
the semiconductor part further includes a fifth semiconductor layer of the second conductivity type provided between the first semiconductor layer and the first electrode.

10. The device according to claim 1, wherein
the third electrode includes conductive polysilicon.

11. The device according to claim 10, wherein
the third electrode has a prescribed resistance value controlled by a concentration of an impurity doped into the polysilicon.

12. The device according to claim 1, wherein
the semiconductor part includes an active region and a termination region, the termination region surrounding the active region in a plan view parallel to the back surface, the second electrode being provided on the active region; and the third semiconductor layer includes a plurality of first portions and a second portion, the plurality of first portions being arranged along the boundary between the active region and the termination region, the second portion being provided between two first portions among the plurality of first portions that are next to each other, the second portion includes a second-conductivity-type impurity with a lower concentration than a concentration of a second-conductivity-type impurity in the first portion.

13. The device according to claim 1, wherein
the second semiconductor layer includes an outer edge in a plan view parallel to the front surface of the semiconductor part, the outer edge of the second semiconductor layer being quadrilateral, and a first distance from a corner of the outer edge of the second semiconductor layer to the third semiconductor layer is greater than a second distance from a side of the outer edge of the second semiconductor layer to the third semiconductor layer.

14. The device according to claim 1, wherein
the semiconductor part further includes at least one sixth semiconductor layer of the second conductivity type provided in the termination region, and the sixth semiconductor layer is apart from the third semiconductor layer and surrounds the third semiconductor layer at the front surface side of the semiconductor part.

\* \* \* \* \*